United States Patent
Phan et al.

(10) Patent No.: US 7,214,550 B2
(45) Date of Patent: May 8, 2007

(54) METHOD TO PRODUCE THIN FILM RESISTOR USING DRY ETCH

(75) Inventors: Tony Thanh Phan, Flower Mound, TX (US); Daniel Tsai, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 53 days.

(21) Appl. No.: 10/921,745

(22) Filed: Aug. 19, 2004

(65) Prior Publication Data

US 2006/0040458 A1    Feb. 23, 2006

(51) Int. Cl.
*H01L 21/00* (2006.01)

(52) U.S. Cl. ............................................. 438/8

(58) Field of Classification Search ................ 438/689, 438/8; 264/1.33
See application file for complete search history.

(56) References Cited

U.S. PATENT DOCUMENTS

| | | | |
|---|---|---|---|
| 5,679,213 A | 10/1997 | Noshiro | |
| 6,323,093 B1 | 11/2001 | Xiang et al. | |
| 6,787,071 B2 * | 9/2004 | Gorczyca et al. | 264/1.33 |
| 6,855,585 B1 | 2/2005 | Kalnitsky et al. | |
| 2001/0046771 A1 * | 11/2001 | Steinmann et al. | 438/689 |
| 2003/0168599 A1 | 9/2003 | Liddiard | |

* cited by examiner

*Primary Examiner*—Carl Whitehead, Jr.
*Assistant Examiner*—Monica D. Harrison
(74) *Attorney, Agent, or Firm*—Jacqueline J. Garner; W. James Brady, III; Frederick J. Telecky, Jr.

(57) ABSTRACT

A method of fabricating a thin film resistor (100). The resistor material (104), e.g., NiCr, is deposited. A hard mask material (106), e.g., TiW, may be deposited over the resistor material (104). The resistor material (104) and hard mask material (106) are patterned and sputter etched to form the resistor body. For example, a sputter etch chemistry comprising $BCl_3$, $Cl_2$, and Ar may be used to etch the resistor material.

15 Claims, 3 Drawing Sheets

METHOD TO PRODUCE THIN FILM RESISTOR USING DRY ETCH

FIELD OF THE INVENTION

The invention is generally related to the field of forming thin film resistors in semiconductor devices and more specifically to a dry etch for removing the thin film resistor material.

BACKGROUND OF THE INVENTION

Thin film resistors are often used in precision analog-to-digital and digital-to-analog integrated circuits for precision data conversion, which may require precise control of the resistance of the thin film resistor over the operating temperatures and voltages. Often the final fine control of the resistance of these precision thin film resistors must be done using laser trimming. A widely used thin film resistor may be formed, for example, from a deposited layer of nickel and chromium alloy and defined using wet chemical etching to remove unwanted thin film resistor material. However, such wet etching techniques may suffer from dimension control problems such as the formation of a jagged etch on the thin film resistor body, resulting in resistor mismatch. FIG. 1 is a top view of a prior art resistor illustrating the jagged edge 10 on the resistor material 12. Because the width of the thin film resistor can substantially affect the resistance of the thin film resistor, such dimension control problems may impair the ability to construct thin film resistors having a precise resistance and may result in yield losses during manufacturing of precision integrated analog circuits incorporating such thin film resistors.

SUMMARY OF THE INVENTION

The invention is a method for forming a thin film resistor in an integrated circuit. After the resistor material is deposited, it is patterned and etched using a dry sputter etch process.

An advantage of the invention is the elimination of prior art jagged edges and the corresponding thin film resistor mismatch.

This and other advantages will be apparent to those of ordinary skill in the art having reference to the specification in conjunction with the drawings.

DETAILED DESCRIPTION OF THE EMBODIMENTS

The following description of the preferred embodiments is merely exemplary in nature and is in no way intended to limit the invention or its application or uses. For example, the embodiments of the invention are described in conjunc tion with a NiCr resistor material, TiW hardmask, and Al head in an aluminum metallization process. It will be apparent to those of ordinary skill in the art that the benefits of the invention may be applied to other resistor materials, other hardmask materials, and other metallization schemes, such a copper damascene processes. The present invention discloses a process for manufacturing a thin film resistor in an integrated circuit using a dry etch process.

Figure 2:
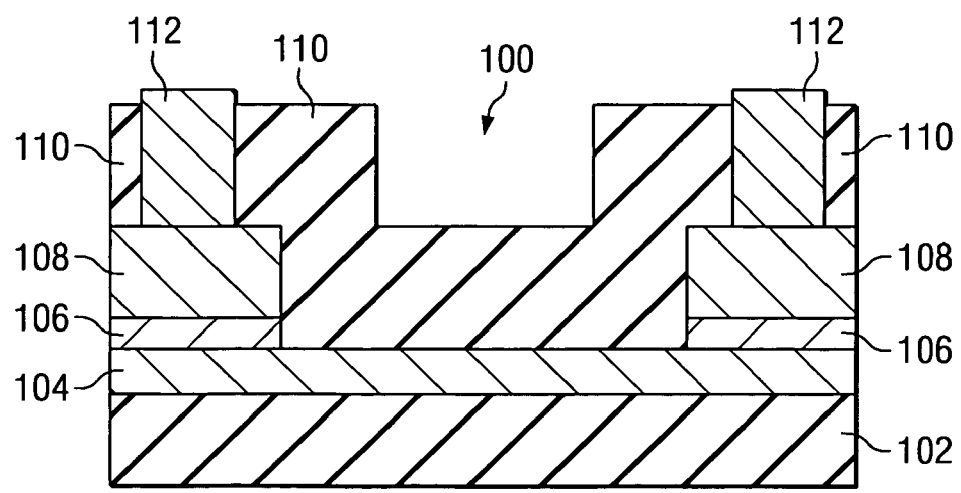
FIG. 2 is a cross-sectional diagram of the thin film resistor according to an embodiment of the invention.

A thin film resistor (TFR) 100 formed according to a first embodiment of the invention is shown in FIG. 2. TFR 100 is located on a dielectric 102. In a preferred embodiment, dielectric 102 is an interlevel dielectric typically used between metal interconnect levels of an integrated circuit. Metal interconnect levels are formed over a semiconductor body having transistors and/or other devices formed thereon. Alternatively, dielectric 102 may comprise a field oxide region or a shallow trench isolation region. TFR 100 comprises a NiCr layer 104. NiCr layer 104 functions as the thin film resistor body. Other suitable thin film resistor materials are known in the art. For example, tantalum-nitride (TaN) or silicon chromium (SiCr) may alternatively be used. TiW hardmask regions 106 are located at the ends of the NiCr layer 104. Overlying TiW hardmask 106 is Al head layer 108. Contact is made to TFR 100 from an overlying metal interconnect (not shown) through vias 112 that extend through an overlying dielectric 110.

Figure 3A:
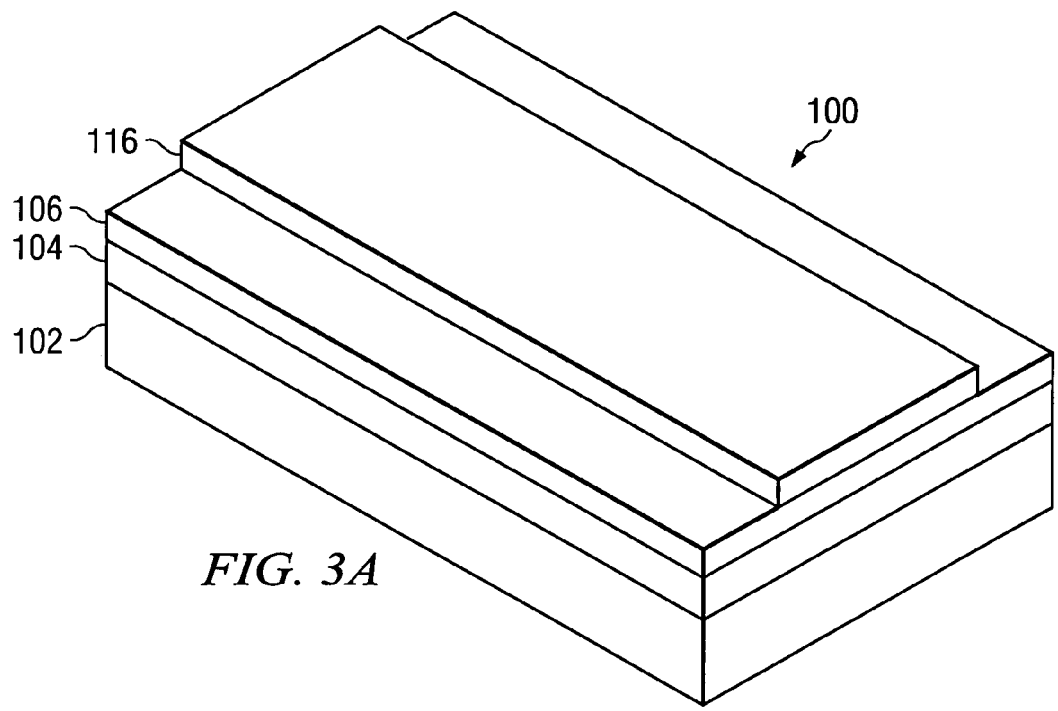
FIGS. 3A–3D are three-dimensional diagrams of the thin film resistor of FIG. 2 at various stages of fabrication.

A method of fabricating TFR 100 according to a first embodiment of the invention will now be discussed in conjunction with FIGS. 3A–3D. Referring to FIG. 3A, a layer of resistor material 104 is deposited over the surface of a dielectric layer 102. Preferably, dielectric 102 is an interlevel dielectric suitable for use between metal interconnect levels. Preferably, resistor material 104 comprises an alloy of nickel and chromium (NiCr) and may be, for example, around 40 nm thick. Other suitable resistor materials, such as SiCr, are known in the art. NiCr layer 104 is annealed at some point in the process. It may be annealed right after deposition using, for example a 410° anneal in air for 30 minutes followed by a 410° anneal in a forming gas for 30 minutes. A TiW hard mask layer 106 is deposited over the surface of NiCr layer 104. TiW hard mask layer 106 substantially prevents NiCr layer 104 from being etched and protects NiCr layer 104 against diffusion of other materials and contaminates. TiW hard mask layer 106 may, for example, be about 200 nm thick.

Still referring to FIG. 3A, a pattern 116 is formed over TiW hard mask layer 106. Pattern 116 is used to define the location of TFR 100 by masking the area where TFR 100 is desired. Pattern 116 may comprise a photoresist pattern as is known in the art.

Figure 3B:
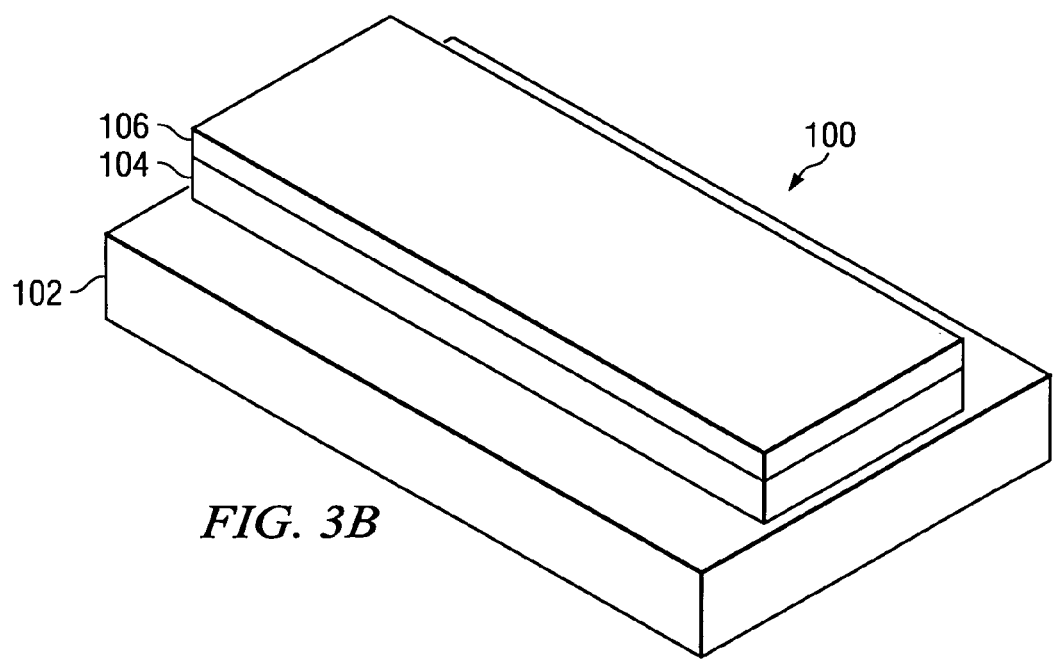

With pattern 116 is place, the resistor etch is performed. TiW hard mask layer 106 and NiCr layer 104 are dry etched to remove the portions exposed by pattern 116 and form NiCr resistor body 104, as shown in FIG. 3B. A sputter etch is utilized to etch the NiCr layer 104 in contrast to a chemical etch. The sputter etch uses a physical momentum transfer to remove the desired material whereas typical plasma etching relies on a chemical reaction to remove the desired material. An etch chemistry with good sputtering efficiency should be selected. The molecular mass of the etch chemistry is selected to tune sputter etch efficiency for the resistor material.

A more detailed example of the above sputter etch will now be described. The exposed portions of TiW hardmask 106 may be removed using a dry etch chemistry comprising $BCl_3$ and $SF_6$. (The TiW hardmask 106 is etched into its final shape later in the process.) Low flow rates are used consistent with a physical or sputter etch. (In contrast, higher flow rates indicate a chemical etch.) A preferred embodiment uses about 60 sccm of $BCl_3$ and about 40 sccm of $SF_6$ with a power of around 300 W (top RF)/150 W (bottom RF) until endpoint with an over etch at a power of around 300 W(top RF)/100 W(bottom RF). The NiCr resistor material 104 may be removed using a dry etch chemistry of $BCl_3/Cl_2/Ar$. A preferred embodiment uses about 15 sccm of $BCl_3$, about 55 sccm of $Cl_2$, and about 15 sccm of Ar at a power of around 350 W(top RF)/250 W(bottom RF). The top RF power is selected to control the plasma density and the bottom RF power is selected to determine the sputtering power. The pressure is about 10 mTorr. For cooling, the electrostatic chuck (ESC) temperature may be about 60° C. and helium flow may be used for wafer backside cooling at a pressure of about 10 Torr. Preferably, the wafer is placed in a process chamber, both the TiW hardmask 106 and NiCr resistor material 104 are sputter etched, and the wafer is removed from the process chamber. In other words, one dry etch operation may be used to etch both the hard mask layer 106 and resistor material 104 by just changing the gas flows. Pattern 116 is then removed. The resulting structure is shown in FIG. 3B.

Figure 1:
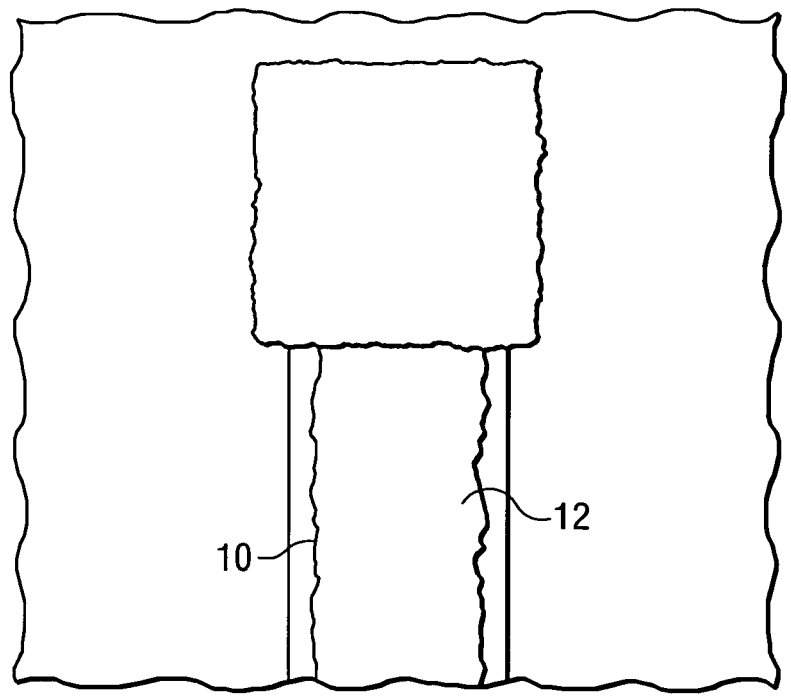
FIG. 1 is a top view diagram of a prior art thin film resistor having jagged edges as a result of a wet etch.

Using a dry etch for the resistor etch is preferable as wet etching tends to result in jagged edges on the resistor material as shown in FIG. 1. A dry etch avoids the resistor mismatch that can occur with wet etching. However, suitable dry etches for NiCr were not previously known. However, the dry sputter etch of the invention provides a uniform, repeatable etch with smooth edges. It should be noted that the sputter etch rate should be controlled to avoid burnt resist caused by the imbalance of heating from sputtering and the cooling of the wafer. Burnt resist affects the shape and quality of the resulting film. Accordingly, the sputter etch rate as controlled by RF powers is balanced with the wafer cooling via, for example, an electrostatic chuck (ESC) with helium flow.

Figure 3C:
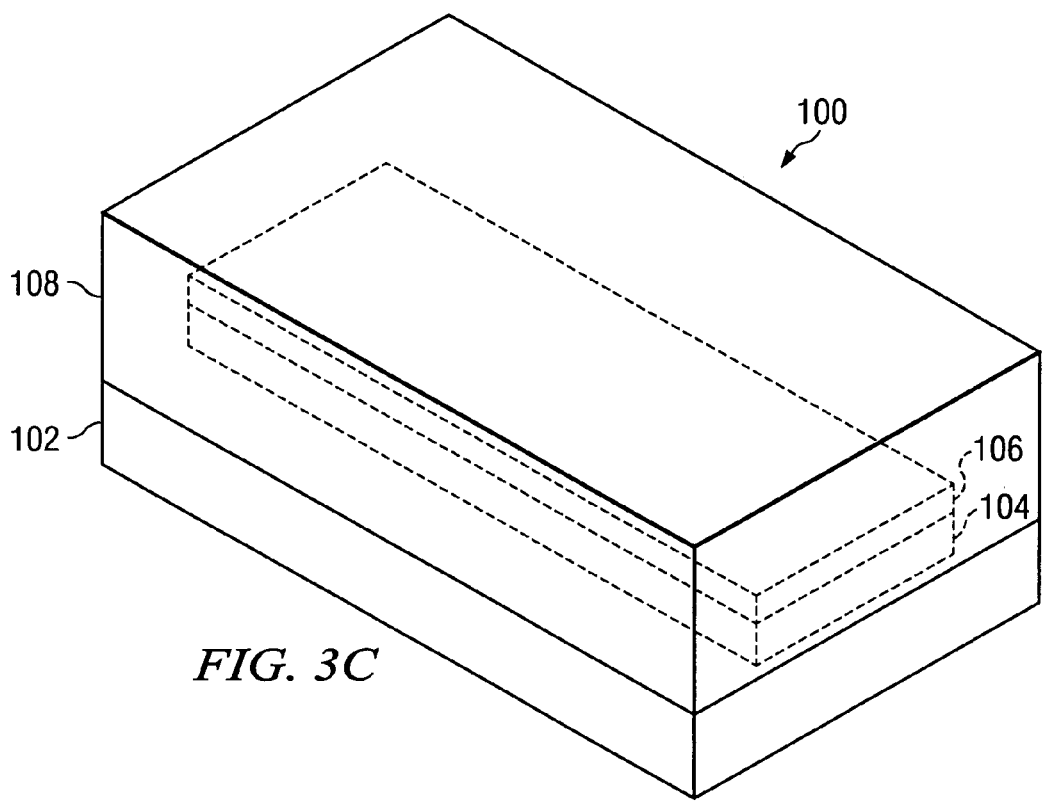
Figure 3D:
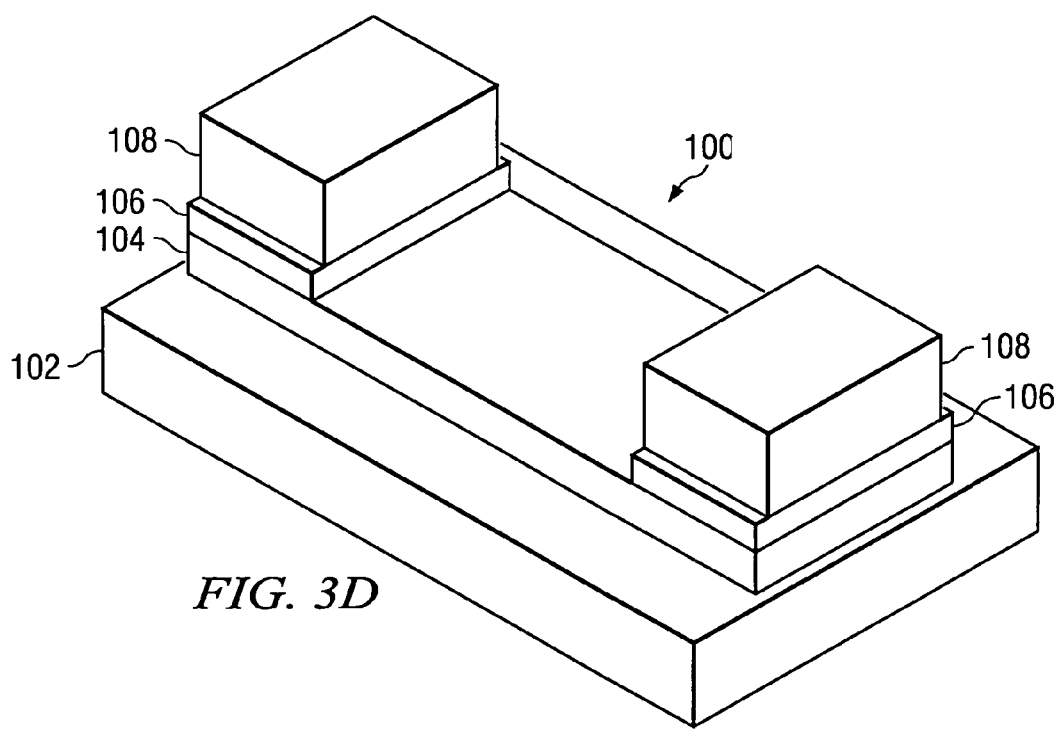

Once the NiCr resistor body 104 is defined, an aluminum head masking layer 108 is deposited as shown in FIG. 3C. Head masking layer 108 comprises a conductive material such as aluminum or copper. Al head layer 108 and TiW hardmask 106 are then patterned and etched to form the resistor heads (contact areas for the resistor), as shown in FIG. 3D. For example, a dry etch may be used to remove the undesired areas of Al head 108. Then, the undesired portions of TiW hard mask layer 106 are removed. The exposed portions of TiW hard mask layer 106 may be removed using a wet etch.

Next, a dielectric 110 is deposited over the structure. Then, a via 120 is etched into dielectric 110 to expose a portion of Al head 108 at each end of the resistor. Vias 120 are then filled with conductive material as is known in the art. The resulting structure is shown in FIG. 2. Processing then continues to form one or more metal interconnects and package the device.

Using a sputter etch to etch the resistor material according to the invention avoids resistor mismatch and improves the yield. Table 1 below shows experimental results comparing various sputter etch times to a standard wet etch process. The sputter etch was performed using a dry chemistry comprising $BCl_3/Cl_2/Ar$. The 30 sec and 20 sec sputter etch times resulted in improved MPY (multiprobe yield) versus the standard wet etch. (The 10 sec sputter etch resulted in an incomplete NiCr etch.) The parameters NiCr Body Serpentine RES and NiCr Sheet Res 25/7 are lower for dry etch groups. This indicates the wet etch undercut the TiW hard mask causing CD loss. This undercutting is not indicated in the dry etch groups.

TABLE 1

| | Sputter Etch Time | | | | | | Standard | |
| | 30 sec | | 20 sec | | 10 sec | | Wet + Wet | |
|---|---|---|---|---|---|---|---|---|
| Wafer | 02 | 03 | 05 | 06 | 08 | 09 | 11 | 12 |
| MPY | 25 | 23 | 27 | 28 | 0 | 0 | 20 | 20 |
| B49 | 36 | 30 | 36 | 38 | 0 | 0 | 41 | 39 |
| B49-normalized | 59 | 56 | 57 | 57 | 0 | 0 | 67 | 66 |
| B(12 + 13 + 14 + 42 + 45) | 4 | 2 | 3 | 4 | 2 | 0 | 11 | 5 |
| Delta-W | 0.1 | 0.1 | −0.3 | −0.3 | −1.0 | −2 | 0.0 | 0.0 |
| Head Resistance | 166 | 178 | 161 | 189 | 223 | 313 | 178 | 189 |
| Slope RS | 160 | 155 | 158 | 159 | 162 | 166 | 155 | 155 |
| NiCr Body Serpent Res | 50640 | 49814 | 47167 | 47092 | 1418 | 1040 | 62235 | 59777 |
| NiCr Sheet Res 25/7 | 179 | 175 | 167 | 167 | 154 | 137 | 170 | 167 |
| NiCr Sheet Res 200/50 | 163 | 160 | 160 | 162 | 157 | 144 | 158 | 155 |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method of fabricating an integrated circuit, comprising the steps of:
   depositing a layer of resistor material;
   forming a pattern over said layer of resistor material; and
   sputtering etching said layer of resistor material to form a thin film resistor body, wherein said sputter etching strip comprises the steps of:
      flowing $BCl_3$ at a flow rate of about 15 sccm;
      flowing $Cl_2$ at a flow rate of about 55 sccm; and
      flowing Ar at a flow rate of about 15 sccm.

2. The method of claim 1, wherein said layer of resistor material comprises NiCr.

3. The method of claim 1, further comprising the steps of:
   depositing a hard mask layer over said layer of resistor material; and after forming said pattern, sputter etching said hard mask material prior to sputter etching said layer of resistor material.

4. The method of claim 1, wherein said hard mask material comprises TiW.

5. A method of fabricating an integrated circuit, comprising the steps of:
providing a semiconductor body having a first dielectric layer formed thereover;
depositing a layer of resistor material over said first dielectric layer;
depositing a hard mask material over said layer of resistor material;
forming a resistor pattern over said hard mask material;
sputter etching said hard mask material, wherein said sputter etching of the hard mask layer step uses an etch chemistry comprising $BCl_3$ and $SF_6$; and
sputter etching said layer of resistor material to form a resistor body.

6. The method of claim 5, further comprising the steps of:
removing said resistor pattern;
depositing a head masking layer over said hard mask material; and
patterning and etching said head masking layer and said hard mask material to form resistor heads at ends of said resistor body.

7. The method of claim 6, wherein said head masking layer comprises aluminum.

8. The method of claim 5, further comprising the steps of:
depositing a second dielectric layer over said resistor body;
etching vias in said second dielectric layer to expose a portion of each resistor head; and
filling said vias with a conductive material.

9. The method of claim 5, wherein said sputter etching of the resistor material step uses an etch chemistry comprising $BCl_3$, $Cl_2$, and Ar.

10. The method of claim 5, wherein said resistor material comprises NiCr.

11. The method of claim 5, wherein said hard mask material comprises TiW.

12. The method of claim 5, wherein said sputter etching of the hard mask layer and said sputter etching of the resistor material are performed in the same chamber as part of the same operation.

13. A method for fabricating a thin film resistor on a semiconductor body, comprising the steps of:
depositing an alloy of nickel and chromium over a first dielectric layer; and
sputter etching to remove a portion of said alloy to form a resistor body, wherein sputter etching uses an etch chemistry comprising $BCl_3$, $Cl_2$, and Ar, wherein said sputter etching step comprising the steps of:
flowing $BCl_3$ at a flow rate of about 15 sccm;
flowing $Cl_2$ at a flow rate of about 55 sccm; and
flowing Ar at a flow rate of about 15 sccm.

14. The method of claim 13, further comprising the steps of:
depositing a hard mask layer over said alloy of nickel and chromium; and
prior to said sputter etching step, etching said hard mask layer.

15. The method of claim 14, further comprising the steps of:
forming a head masking material over said hard mask layer;
forming a pattern over said head masking material,
etching said head masking material;
wet etching said hard mask material; and
then removing said pattern.

* * * * *